United States Patent [19]

Kato

[11] 4,215,356

[45] Jul. 29, 1980

[54] JUNCTION FIELD EFFECT TRANSISTOR

[75] Inventor: Mari Kato, Itami, Japan

[73] Assignee: Mitsubishi Denki Kabushiki Kaisha, Tokyo, Japan

[21] Appl. No.: 897,775

[22] Filed: Apr. 19, 1978

[30] Foreign Application Priority Data

Apr. 27, 1977 [JP] Japan ................................. 52/49273

[51] Int. Cl.² ........................................... H01L 29/80
[52] U.S. Cl. ......................................... 357/22; 357/20
[58] Field of Search .................................. 357/22, 23

[56] References Cited
U.S. PATENT DOCUMENTS 4,041,517  8/1977  Fuse et al. ............................. 357/22

OTHER PUBLICATIONS

Ozawa et al—Jap. Jour. App. Physics—vol. 15, 1976, pp. 171-177.
Nishizawa et al.—IEEE Trans. on Elec. Devices, vol. ED22, No. 4 (1975), pp. 185-197.

Primary Examiner—Edward J. Wojciechowicz
Attorney, Agent, or Firm—Wenderoth, Lind & Ponack

[57] ABSTRACT

An $N^-$ semiconductor layer is epitaxially grown on an $N^+$ semiconductor substrate serving as a drain region and overlaid with an N type epitaxial layer. Two opposite $P^+$ gate regions are disposed in the surface portion of the N layer to define a channel region between them, and an $N^+$ source region is located above the channel region. That portion of the N layer located between each gate region and the $N^-$ layer has a thickness not smaller than one-half of the channel width of the channel region.

5 Claims, 2 Drawing Figures

JUNCTION FIELD EFFECT TRANSISTOR

BACKGROUND OF THE INVENTION

This invention relates to a structure of a junction field effect transistor.

In the conventional structure of junction field effect transistors it is well known that the high frequency characteristics thereof can be made excellent by increasing the mutual conductance thereof and decreasing the gate-to-drain and gate-to-source capacitances thereof. However, with the high resistivity semiconductor layer epitaxially grown on semiconductor substrates and including a channel region defined by gate regions, a decrease in resistivity of the epitaxial layer has caused both an increase in mutual conductance and an increase in gate-to-drain capacitance. On the other hand, an increase in resistivity has caused a decrease in gate-to-drain capacitance and also an decrease in mutual conductance. In each case, the high frequency characteristics have been deteriorated.

Accordingly, it is an object of the present invention to eliminate the objections to the prior art practice as above described.

It is another object of the present invention to provide a new and improved junction field effect transistor having excellent high frequency characteristics.

It is still another object of the present invention to provide a new and improved junction field effect transistor in which, even with a high mutual conductance, the gate-to-drain capacitance can be a minimum by applying a low voltage across a gate and a drain electrode invovlved.

SUMMARY OF THE INVENTION

The present invention provides a junction field effect transistor comprising a first semiconductor layer of a first type conductivity having a low resistivity, a second semiconductor layer of the first type conductivity disposed on the first semiconductor layer and having a resistivity higher than that of the first semiconductor layer, a third semiconductor layer of the first type conductivity disposed on the second semiconductor layer and having a resistivity less than that of the second semiconductor layer, and gate regions of a second type conductivity selectively disposed in a surface region of the third semiconductor layer to define channel regions in a portion of the third semiconductor layer, the third semiconductor layer including another portion lying between the gate region and the second semiconductor layer and having a thickness not smaller than one half of the channel width of the channel region.

In a preferred embodiment of the present invention, the thickness of the portion of the third semiconductor layer lying between the gate region and the second semiconductor layer is substantially equal to one half of the channel width of the channel region.

BRIEF DESCRIPTION OF THE DRAWINGS

The present invention will become more readily apparent from the following detailed description taken in conjunction with the accompanying drawing in which.

DESCRIPTION OF THE PREFERRED EMBODIMENT

Figure 1:
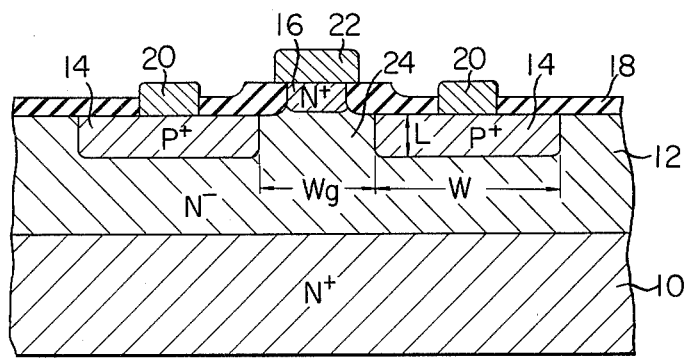
FIG. 1 is a fragmental longitudinal sectional view of a longitudinal vertical type junction field-effect transistor constructed in accordance with the principles of the prior art.

Referring now to FIG. 1 of the drawing, there is illustrated a longitudinal junction field-effect transistor of the conventional structure. The vertical type junction field-effect transistor is abbreviated hereinafter to a "J-FET". The arrangement illustrated comprises an N+ type semiconductor substrate 10 having a low resistivity to form a drain region, and an N− type semiconductor layer 12 epitaxially grown on the substrate 10 and having a high resistivity. Then selective diffusion technique is utilized to form P+ type gate regions 14 disposed in spaced opposite relationship and an N+ type source region 16 located intermediate the P+ type gate regions in the surface portion of the N− type semiconductor layer 12. The N+ type source region 16 is shown in FIG. 1 as having a diffusion front substantially flush with the upper surface of the gate regions 14. The P type regions 14 and the N type region 16 have low resistivities, and the P+ type gate regions 14 form PN junctions with the N− type semiconductor layer 12.

The arrangement further comprises an electrically insulating film 18 disposed on the surface of the semiconductor layer 12 including the P+ type gate region 14 except for the N+ type source region 16, gate electrodes 20 extending through windows formed in the insulating film 18 to be disposed in ohmic contact with the respective gate regions 14, and a source electrode 22 disposed in ohmic contact with the source region 16.

As shown in FIG. 1, the P+ type gate regions 14 define therebetween an N type channel region 24 in the N− type semiconductor layer 12 with the N+ type source region 16.

Thus FIG. 1 shows an N channel type junction field effect transistor.

In J-FET's such as shown in FIG. 1, the mutual conductance gm defined by an increment of a drain current $\Delta I_D$ divided by an increment of a gate voltage $\Delta V_G$ may be generally expressed by $$gm = \mu n \cdot q \cdot N_D \cdot (Wg \cdot ls/L) \quad (I)$$

in the pinch-off region for a null gate bias where $\mu n$ designates a mobility of carriers, q an elementary electric charge, $N_D$ an impurity concentration of the N− type semiconductor layer 12, Wg a gate spacing or a channel width of the channel region 24 (see FIG. 1), ls a source length of the N+ type source region 16, and L designates a channel length of the channel region 24 (see FIG. 1). From the expression (I) it is seen that the higher the impurity concentration $N_D$, that is, the less the resistivity, the higher the mutual conductance gm will be.

Also a gate-to-drain capacity $C_{gd}$ developed between the P+ type gate regions 14 and the N+ type drain region 10 may be generally expressed by $$C_{gd} = \epsilon \cdot \epsilon_0 \cdot \frac{A}{h} \epsilon \cdot \epsilon_0 \cdot lg \left\{ 0.8 \frac{2}{\pi \epsilon} \ln \left( \frac{2W}{\pi h} + 2 \right) \right\} \quad (II)$$

where
 $\epsilon$: relative dielectric constant
 $\epsilon_0$: dielectric constant in vacuum lg: gate length of P+ type gate region 14
W: gate width of P+ type gate region 14 (see FIG. 1)
A: gate diffusion area defined by product of gate length lg and gate width W
$\pi$: circular constant
ln: Napierian logarithm Also h designates a width of a depletion layer from the P+ type gate region 14 extending into the N− type semiconductor layer 12 and expressed by $$h = \sqrt{\frac{2 \cdot \epsilon \cdot \epsilon_O}{q \cdot N_D} \cdot (\phi_T + V_{gd})} \quad \text{(III)}$$

where $\phi_T$ designates a diffusion potential and $V_{gd}$ designates a voltage applied across the gate and drain electrodes. From the expression (II) it is seen that, when the depletion layer from the P+ type gate region 14 scarcely extends into the N− type semiconductor layer 12, the gate-to-drain capacitance $C_{gd}$ is maximum while that capacitance becomes minimum upon the depletion layer reaching the N+ type substrate 10. Therefore, if the impurity concentration $N_D$ of the N− type semiconductor layer 12 is smaller, that is, if the resistivity thereof is higher, then the lower voltage $V_{gd}$ across the gate and drain electrodes can decrease more the gate-to-drain capacitance $C_{gd}$ as will be understood from the expression (III).

It is, however, known that the high frequency characteristics of J-FET's are rendered more excellent by increasing the mutal conductance gm thereof and still decreasing both the gate-to-drain capacitance $C_{gd}$ and the gate-to-source capacitance $C_{gs}$ thereof. In conventional J-FET's such as shown in FIG. 1, a relatively low magnitude of the resistivity of the N− type epitaxially grown semiconductor layer renders not only the mutal conductance gm high but also the gate-to-drain capacitance $C_{gd}$ higher. On the contrary, if a magnitude of that resistivity is relatively high then the $C_{gd}$ is decreased and also the gm is reduced. For example, when the N− type semiconductor layer 12 has a resistivity of 10 ohms centimeter, the mutual conductance gm is on the order of 60 millimhos. Also the mutual conductance gm has a magnitude of 20 millimhos for a resistivity of 50 ohms.-centimeter. This has caused the disadvantage that the high frequency characteristic of the J-FET are deteriorated.

The present invention comtemplates to eliminate the disadvantage just described.

Figure 2:
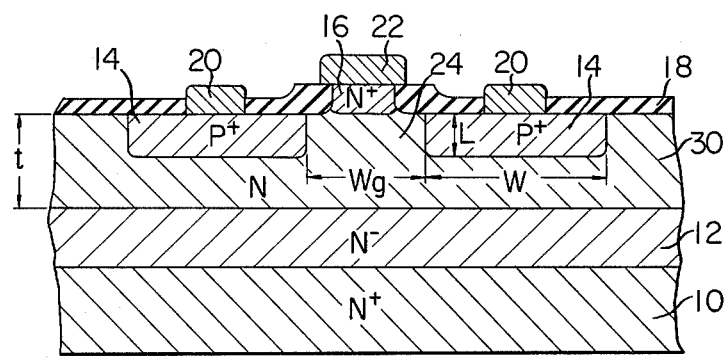
FIG. 2 is a fragmental longitudinal sectional view of a longitudinal vertical type junction field-effect transistor constructed in accordance with the principles of the present invention.

In FIG. 2 wherein like reference numerals designate components identical to those shown in FIG. 1 there is illustrated one embodiment according to the junction field effect transistor of the present invention. The arrangement illustrated is different from that shown in FIG. 1 only in that in FIG. 2, an N type semiconductor layer 30 is disposed on the N− type semiconductor layer 12 according to epitaxial growth technique and has the P+ type gate regions 14 and the N+ type source region 16 disposed in the N type semiconductor layer 30 in the same manner as above described in conjunction with FIG. 1.

In the example illustrated, the N+ type semiconductor substrate 10 has a low resistivity of from 0.1 to 1 ohm.centimeter, and the N− type semiconductor layer 12 has a high resistivity on the order of 50 ohms.centimeter and a thickness of from 5 to 10 microns. The N type semiconductor 30 is epitaxially grown to a thickness of 4 microns on the N− type layer 12 and has a resistivity less than that of the latter, for example, on the order of 10 ohms.centimeter. Also the P+ type gate regions 14 are 2 microns thick and the N+ type source region 16 has a thickness of from 0.6 to 0.7 micron.

From the foregoing, it will readily be understood that the arrangement of FIG. 2 is of a three layer base structure including three N type semiconductor layers having different resistivities and the gate and source regions 14 and 16 respectively are disposed in the surface portion of that N type semiconductor layer having a somewhat high resistivity among them.

When one half the gate spacing expressed by Wg/2 made is smaller than the distance between the diffusion front or bottom of the P+ type gate region 14 and the adjacent surface of the N− type semiconductor layer 12 (which is equal to a thickness of that portion of the N type semiconductor layer 30 lying between the gate region 14 and the N− type semiconductor layer 12) expressed by a dimension of (t−L) where t designates the thickness of the N type semiconductor layer 30, the channel is pinched off within the N type semiconductor layer 30 lower in resistivity than the N− type diffusion layer 12. From the expression (I) it is seen, therefore, that the pinch-off region has its mutual conductance gm whose magnitude is relatively high as determined by the impurity concentration of the N type semiconductor layer 30. Under these circumstances, the depletion layer from each of the P+ type gate regions 14 immediately spreads in both the adjacent portion of the N type semiconductor layer 30 and the N− type semiconductor layer 12 relatively high in resistivity. Therefore the depletion layers reach the N+ type semiconductor substrate 10 with a relatively low voltage $V_{gd}$ across the gate and drain region, to thereby permit the gate-to-drain capacitance $C_{gd}$ to be minimum.

With one half the gate spacing Wg/2 substantially equal to the thickness of N type layer 30 portion (t−L) as above described, the pinch-off occurs substantially simultaneously with the depletion layer from each of the P+ type gate regions 14 reaching the N− type semiconductor layer 12 through the adjacent portion of the N type semiconductor layer 30. Thereby the mutual conductance gm of the pinch-off region becomes high because it is determined by the impurity concentration of the N type semiconductor layer 30.

Also since the depletion layers have already reached the N− type semiconductor layer 12 having the high resistivity upon the pinch-off, the same reach the N+ type substrate 10 with a very low voltage $V_{gd}$ across the gate and source electrodes, to thereby permit the gate-to-drain capacitance $C_{gd}$ to be minimum. This results in improvements in high frequency characteristics. It has been found that Wg/2 substantially being equal to (t−L) is the optimum condition.

On the other hand, with one half the gate spacing Wg/2 greater than the above mentioned thickness of the N type layer 30 portion, the pinch-off is caused in the N− type semiconductor layer 12. Under these circumstances, the depletion layers can reach the N+ type substrate 10 with a very low voltage $V_{gd}$ across the gate and drain electrodes to minimize the gate-to-drain capacitance $C_{gd}$ but to render the mutual conductance gm very low. Therefore the Wg/2 greater than the (t−L) can not be said to be suitable.

From the foregoing it is to be understood that one half the gate spacing or the channel width Wg of the channel region expressed by Wg/2 is required to be equal to or smaller than the above mentioned thickness of the N type layer 30 portion expressed by (t−L).

In summary, the present invention provides a junction field effect transistor comprising a first semiconductor layer of a first type conductivity having a low resistivity, a second semiconductor layer of the first type conductivity disposed on the first semiconductor layer and having a high resistivity, a third semiconductor layer of the first type conductivity disposed on the second semiconductor layer and having a resistivity less than that of the second semiconductor layer, and gate regions selectively disposed in the surface portion of the third semiconductor layer to define channel regions in a portion of the third semiconductor layer, the third semiconductor layer including another portion lying between the gate region and the second semiconductor layer and having a thickness not smaller than one half the channel width of the channel region. Therefore the pinch-off is caused in the third semiconductor layer, to thereby increase the mutual conductance of the pinched-off region while minimizing a gate-to-drain capacitance with a low gate-to-drain voltage resulting in the advantage that the high frequency characteristics are improved.

While the present invention has been illustrated and described in conjunction with a single preferred embodiment thereof, it is to be understood that numerous changes and modifications may be resorted to without departing from the spirit and scope of the present invention. For example, the present invention is eaually applicable to P channel field-effect transistors.

What is claimed is:

1. A vertical type junction field effect transistor comprising:
   a first semiconductor layer of a first type conductivity and having a low resistivity, said first semiconductor layer having first and second surfaces;
   a second semiconductor layer of said first type conductivity and having a resistivity higher than that of said first semiconductor layer, said second semiconductor layer having a first surface disposed on said second surface of said first semiconductor layer and a second surface;
   a third semiconductor layer of said first type conductivity and having a resistivity lower than that of said second semiconductor layer, said third semiconductor layer having a first surface disposed on said second surface of said second semiconductor layer and a second surface;
   gate regions of a second type conductivity selectively disposed in regions of said third semiconductor layer and extending from said second surface thereof to positions spaced between said first and second surfaces thereof;
   adjacent said gate regions defining therebetween at least one channel region in a first portion of said third semiconductor layer; and
   a second portion of said third semiconductor layer, defined between each said gate region and said second surface of said second semiconductor layer, having a thickness not smaller than one-half of the width of said channel region, defined between said adjacent gate regions.

2. A transistor as claimed in claim 1, wherein said thickness of said second portion of said third semiconductor layer is substantially equal to one-half said width of said channel region.

3. A vertical type junction field effect transistor comprising:
   a drain region comprising a semiconductor layer of a first type conductivity and having a low resistivity, said semiconductor layer having first and second surfaces;
   a first exptaxial layer having a first surface epitaxially grown on said second surface of said semiconductor layer and a second surface, said first epitaxial layer having the same type conductivity as said semiconductor layer and a higher resistivity than said semiconductor layer;
   a second epitaxial layer having a first surface epitaxially grown on said second surface of said first epitaxial layer and a second surface, said second epitaxial layer having the same type conductivity as said first epitaxial layer and a lower resistivity than said first epitaxial layer;
   gate regions of a second type conductivity selectively diffused into regions of said second epitaxial layer and extending from said second surface thereof to positions spaced between said first and second surfaces thereof;
   adjacent said gate regions defining therebetween at least one channel region in a first portion of said second epitaxial layer;
   said second epitaxial layer having a second portion defined between each said gate region and said second surface of said first epitaxial layer;
   a source region diffused into said second surface of said second epitaxial layer in the area of said channel region, said source region having the same type conductivity as said second epitaxial layer and a lower resistivity than said second epitaxial layer; and
   the thickness of said second portion of said second epitaxial layer and the width of said channel region, defined between said adjacent gate regions, being correlated such that, upon the application of voltage across said gate regions and said source region and across said source region and said drain region, a depletion layer spreading from said gate regions does not extend to said second surface of said first epitaxial layer at a voltage sufficient to pinch off said channel region.

4. A transistor as claimed in claim 3, wherein said thickness of said second portion of said second epitaxial layer is not smaller than one-half of said width of said channel region.

5. A transistor as claimed in claim 3, wherein said thickness of said second portion of said second epitaxial layer is substantially equal to one-half said width of said channel region.

* * * * *